(12) United States Patent
Hirose

(10) Patent No.: US 10,044,352 B2
(45) Date of Patent: Aug. 7, 2018

(54) ELECTRONIC EQUIPMENT AND AUTOMOBILE MOUNTING THE SAME

(71) Applicant: TOYOTA JIDOSHA KABUSHIKI KAISHA, Toyota-shi, Aichi-ken (JP)

(72) Inventor: Satoshi Hirose, Toyota (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 248 days.

(21) Appl. No.: 14/981,564

(22) Filed: Dec. 28, 2015

(65) Prior Publication Data

US 2016/0218706 A1 Jul. 28, 2016

(30) Foreign Application Priority Data

Jan. 26, 2015 (JP) ................................. 2015-012502

(51) Int. Cl.
| | | |
|---|---|---|
| *H03K 17/00* | (2006.01) | |
| *H03K 17/16* | (2006.01) | |
| *H03K 17/567* | (2006.01) | |
| *H03K 17/687* | (2006.01) | |
| *B60L 11/18* | (2006.01) | |
| *H03K 19/003* | (2006.01) | |
| *H02M 1/32* | (2007.01) | |
| *H02M 3/158* | (2006.01) | |

(52) U.S. Cl.
CPC ........ *H03K 17/168* (2013.01); *B60L 11/1803* (2013.01); *H03K 17/567* (2013.01); *H03K 17/6871* (2013.01); *H02M 1/32* (2013.01); *H02M 3/158* (2013.01); *H03K 19/003* (2013.01)

(58) Field of Classification Search
CPC ......... H03K 17/168; H03K 17/00; G01R 1/00

USPC .......................................................... 307/9.1
See application file for complete search history.

(56) References Cited

U.S. PATENT DOCUMENTS

| | | | |
|---|---|---|---|
| 2001/0005028 A1 | 6/2001 | Shimoida et al. | |
| 2008/0206908 A1* | 8/2008 | Walter | G01R 31/2831 438/18 |
| 2011/0174799 A1* | 7/2011 | Ali | H05B 3/267 219/446.1 |
| 2014/0015019 A1* | 1/2014 | Okamoto | H01L 29/78 257/288 |

FOREIGN PATENT DOCUMENTS

| | | |
|---|---|---|
| JP | 3602418 B2 | 12/2004 |
| JP | 2013-175578 A | 9/2013 |

* cited by examiner

*Primary Examiner* — Rexford Barnie
*Assistant Examiner* — Joseph Inge
(74) *Attorney, Agent, or Firm* — Oliff PLC

(57) ABSTRACT

An electronic equipment is provided with a semiconductor device including an electrode joined to an electric conductor via a joint layer, a calculator and a controller. The semiconductor device is configured to pass current bidirectionally. The calculator is configured to calculate an imbalance EM progression index. The imbalance EM progression index is a difference between a forward current EM progression index and a reverse current EM progression index. The controller is configured to: adopt a condition to accelerate an increase rate of the reverse current EM progression index in at least a part of an excessive forward current EM period; and adopt a condition to accelerate an increase rate of the forward current EM progression index in at least a part of an excessive reverse current EM period.

5 Claims, 8 Drawing Sheets

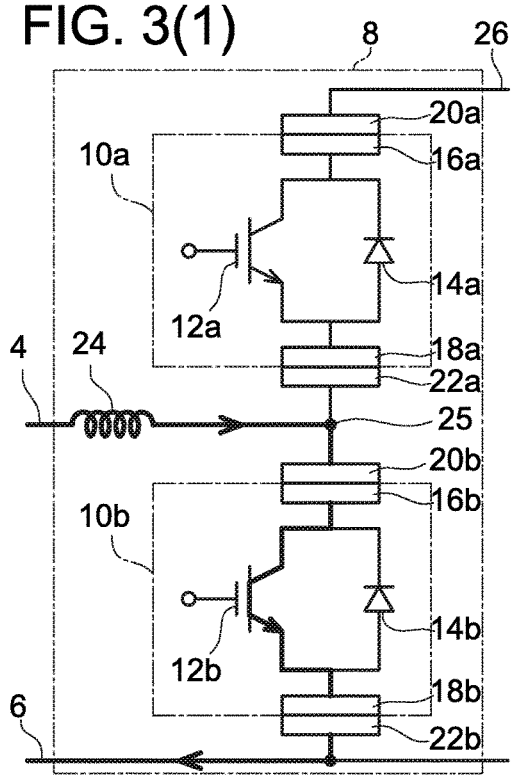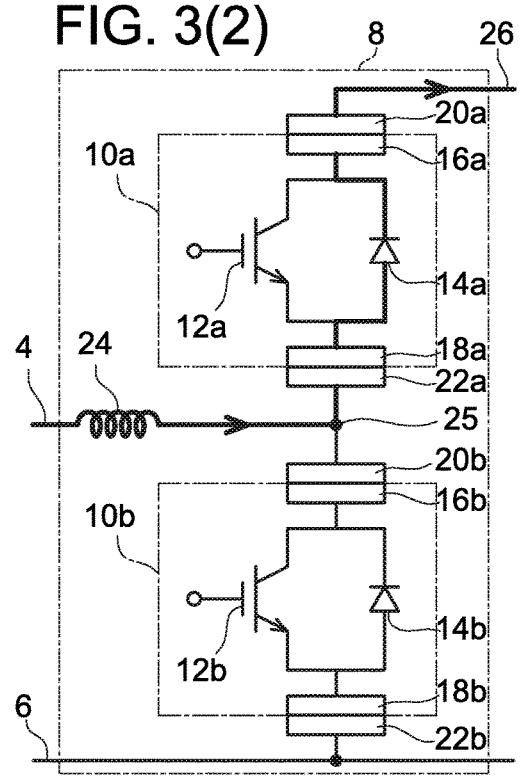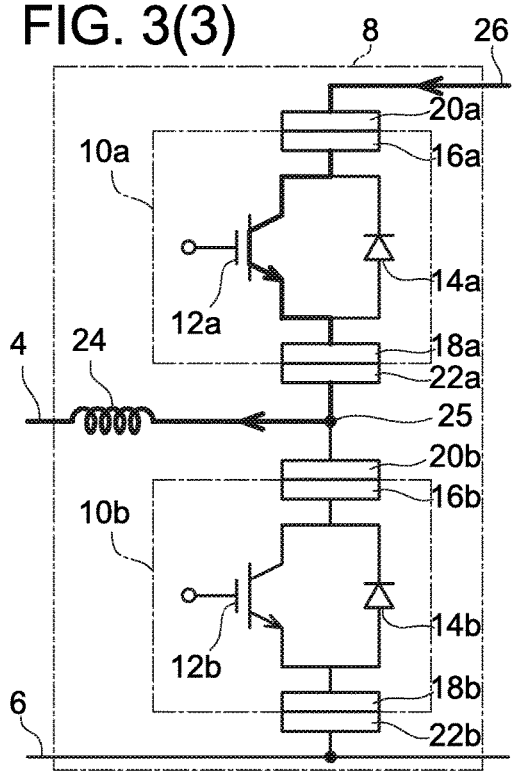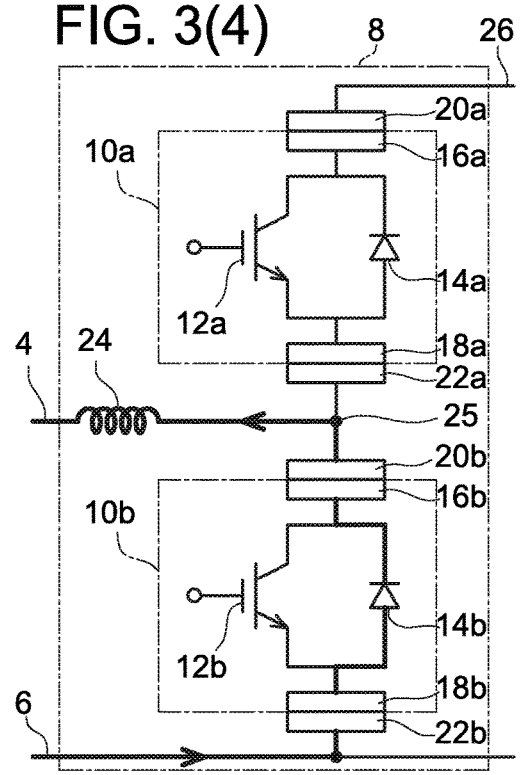

ELECTRONIC EQUIPMENT AND AUTOMOBILE MOUNTING THE SAME

CROSS-REFERENCE TO RELATED APPLICATION

This application claims priority to Japanese Patent Application No. 2015-012502 filed on Jan. 26, 2015, the entire contents of which are hereby incorporated by reference into the present application.

TECHNICAL FIELD

The present disclosure relates to an electronic equipment in which a semiconductor device having an electrode exposed on a surface of the semiconductor device is joined to an electric conductor via a joint layer, and also relates to an automobile on which the electronic equipment is mounted.

DESCRIPTION OF RELATED ART

A semiconductor device including an electrode exposed on a surface of the semiconductor device is used under a state where the electrode is joined to an electric conductor via a joint layer. Current flows through the joint layer. When current flows through the joint layer, a phenomenon occurs in which ions forming the joint layer are moved. In the present disclosure, this phenomenon is called electromigration, and is abbreviated as EM. Progression of EM leads to occurrence of a defect in the joint layer, and thus results in unstable operation of an electronic equipment. Japanese Patent Application Publication No. 2013-175578 discloses a technology for suppressing the progression of EM. In the technology disclosed in Japanese Patent Application Publication No. 2013-175578, a metal layer that suppresses the progression of EM is added.

SUMMARY

In the technology for adding the metal layer, an extra metal layer is needed, and this causes costs to be increased. Moreover, the technology needs a lot of processes since it is necessary to change a type of metal depending on a direction along which current is passed. The present disclosure relates to a technology that suppresses the progression of EM without the addition of a metal layer.

In the disclosed electronic equipment, a semiconductor device passes current bidirectionally, and a direction of current is switched over time between a state in which forward current flows through a joint layer and a state in which reverse current flows through the joint layer.

For example, in a semiconductor device 10 shown in FIG. 1(1), an IGBT 12 and a diode 14 are connected in parallel, and a high potential electrode 16 and a low potential electrode 18 are exposed on a front surface of the semiconductor device 10. The high potential electrode 16 is connected via a high potential joint layer 20 to an unillustrated high potential electric conductor, and the low potential electrode 18 is connected via a low potential joint layer 22 to an unillustrated low potential electric conductor. The semiconductor device 10 is bidirectional, and in the semiconductor device 10, as shown in arrows (a), current may flow from the high potential electrode 16 toward the low potential electrode 18 via the IGBT 12, or as shown in arrows (b), current may flow from the low potential electrode 18 toward the high potential electrode 16 via the diode 14. In a transient state or the like, a potential of the low potential electrode 18 may be temporarily higher than that of the high potential electrode 16, and thus reverse current may flow. In the present disclosure, the current flowing from the high potential electrode 16 toward the low potential electrode 18 is referred to as forward current, and the current flowing from the low potential electrode 18 toward the high potential electrode 16 in a transient state or the like is referred to as reverse current. The semiconductor device 10 of FIG. 1(1) passes current bidirectionally, and the direction of the current is switched over time between a state in which the forward current flows and a state in which the reverse current flows. Accordingly, the direction of the current is switched over time between a state where the forward current flows through the joint layers 20 and 22 and a state where the reverse current flows through the joint layers 20 and 22.

The electronic equipment of the present disclosure comprises a calculator and a controller. The calculator is configured to calculate an imbalance EM progression index. The imbalance EM progression index is a difference between a progression index (referred to herein as a forward current EM progression index) of EM generated in the joint layer due to the flowing of the forward current through the joint layer and a progression index (referred to herein as a reverse current EM progression index) of EM generated in the joint layer due to the flowing of the reverse current through the joint layer. The controller is configured to cause phenomena that suppress the progression of the EM by cancelling out the forward current EM with the reverse current EM or by cancelling out the reverse current EM with the forward current EM. The controller is configured to adopt a condition to accelerate an increase rate of the reverse current EM progression index in at least a part of an excessive forward current EM period during which the forward current EM progression index is larger than the reverse current EM progression index. Also, the controller is configured to adopt a condition to accelerate an increase rate of the forward current EM progression index in at least a part of an excessive reverse current EM period during which the reverse current EM progression index is larger than the forward current EM progression index.

In a case of FIG. 1(1), while the forward current shown in arrows (a) is passed, the forward current EM proceeds to the joint layers 20 and 22, and while the reverse current shown in arrows (b) is passed, the reverse current EM proceeds to the joint layers 20 and 22. A direction in which ions causing EM are moved is changed depending on the direction in which current is passed. When the reverse current EM is generated after the forward current EM is generated, the forward current EM is cancelled out by the reverse current EM, and thus a progression index of the EM generated in the joint layers 20 and 22 is reduced. Likewise, when the forward current EM is generated after the reverse current EM is generated, the reverse current EM is cancelled out by the forward current EM, and thus the progression index of the EM generated in the joint layers 20 and 22 is reduced. When both the forward current EM progression index and the reverse current EM progression index are assumed to have a same positive or negative sign, a difference (imbalance amount) between the forward current EM progression index and the reverse current EM progression index indicates the progression index of the EM that is actually generated in the joint layers 20 and 22.

When the progression index (the forward current EM progression index) of the EM generated in the joint layer due to the flow of the forward current through the joint layer is larger than the progression index (the reverse current EM progression index) of the EM generated in the joint layer due to the flow of the reverse current through the joint layer, it can be said that the forward current EM is excessive. In this case, the controller adopts the condition to accelerate the increase rate of the reverse current EM progression index. Thus, when the EM caused by the forward current is excessive, the controller thereafter adopts the condition to accelerate the increase rate of the progression index of the EM caused by the reverse current. Hence, the excessive EM generated by the forward current is cancelled out by the subsequent reverse current, and thereafter the imbalance amount of EM is reduced.

By contrast, when the forward current EM progression index is smaller than the reverse current EM progression index, it can be said that the reverse current EM is excessive. In this case, the controller adopts the condition to accelerate the increase rate of the forward current EM progression index. Hence, the excessive EM generated by the reverse current is cancelled out by the subsequent forward current, and thereafter the imbalance amount of EM is reduced, With the technology described above, it is possible to suppress the EM that actually is being generated (the imbalance amount of the forward current EM and the reverse current EM =an absolute value of a difference between the forward current EM progression index and the reverse current EM progression index) from developing to be a large absolute value.

In the case of FIG. 1(1), since a current of a same intensity flows in a same direction through the joint layer 20 and the joint layer 22, it can be assumed that the EM generated in the joint layer 20 is the same as the EM generated in the joint layer 22. When the imbalance amount of EM generated in the joint layer 20 and the imbalance amount of EM generated in the joint layer 20 is controlled so as to be reduced, the imbalance amount of EM generated in the joint layer 22 is also reduced. Likewise, when the imbalance amount of EM generated in the joint layer 22 and the imbalance amount of EM generated in the joint layer 22 is controlled so as to be reduced, the imbalance amount of EM generated in the joint layer 20 is also reduced. In the technology described in the present disclosure, in a case where a plurality of joint layers is present, an advantageous effect may also be obtained even by applying the technology to one of the joint layers. In a case where a semiconductor device is joined to an electric conductor via a plurality of joint layers, the present technology may not need to be applied to all the joint layers, and the advantageous effect may also be obtained by applying the technology to one of the joint layers.

The semiconductor device 10 of FIG. 1(1) is simply an example, and the disclosure is not limited to this example. For example, FIG. 1(2) shows a semiconductor device 10a that incorporates a MOS, and even in the semiconductor device 10α, a direction of current is switched over time between a state in which forward current flows through joint layers 20α and 22α and a state in which a reverse current flows through joint layers 20α and 22α. The technology described in the present disclosure is also useful for the semiconductor device shown in FIG. 1(2).

In a case of a semiconductor device 10β of FIG. 1(3), parallel circuits each of an IGBT 12 and a diode 14 are connected in series. Even in this device, a direction of current is switched over time between a state in which forward current flows through joint layers 20β and 22β and a state in which reverse current flows through the joint layers 20β and 22β. As will be described in detail later, in the case of FIG. 1(3), the direction of the current is switched over time among an arrow (a2) indicating a state where the forward current flows through the joint layer 22β, an arrow (b1) indicating a state where the reverse current flows through the joint layer 20β, an arrow (a1) indicating a state where the forward current flows through the joint layer 20β and an arrow (b2) indicating a state where the reverse current flows through the joint layer 22β. In this case, the state where the forward current flows through the joint layer 20β and the state where the forward current flows through the joint layer 22β occur at different times, and the state where the reverse current flows through the joint layer 20β and the state where the reverse current flows through the joint layer 22β occur at different times. A magnitude of the current flowing through the joint layer 20β differs from a magnitude of the current flowing through the joint layer 22β. The technology described herein can be applied to the electronic equipment shown in FIG. 1(3), that is, the equipment having two or more joint layers 20β and 22β that differ in the direction of the current being passed and a value of the current being passed. As will be described later, the technology can also be applied to an electronic equipment that has three or more joint layers 20β, 22β and 38β.

The semiconductor devices shown in FIGS. 1(1) and 1(2) may form an upper arm or a lower arm in a bidirectional converter (performing both a voltage boosting function and a voltage reducing function) mounted on an electric automobile. The semiconductor device shown in FIG. 1(3) may form a bidirectional converter mounted on an electric automobile. The technology described in the present disclosure can be applied to a joint layer via which the semiconductor device configuring the bidirectional converter mounted on the electric automobile is joined to an electric conductor.

The controller may increase a temperature of the joint layer when the reverse current flows in the at least part of the excessive forward current EM period, and may increase the temperature of the joint layer when the forward current flows in the at least part of the excessive reverse current EM period. When the temperature of the joint layer is increased, the progression rate of the EM is increased. In other words, the increase rate of the progression index of the EM is accelerated. When the temperature of the joint layer when the reverse current flows in the excessive forward current EM period is increased, the increase rate of the progression index of the EM while the reverse current is being passed is accelerated. Therefore, the imbalance amount in which the forward current EM is excessive is reduced while the reverse current is being passed. As a result, the EM actually being generated in the joint layer is reduced. Likewise, when the temperature of the joint layer when the forward current flows in the excessive reverse current EM period is increased, the imbalance amount in which the reverse current EM is excessive is reduced while the forward current is being passed. As a result, the EM actually being generated in the joint layer is reduced.

The controller may increase occasions at which the reverse current flows during the excessive forward current EM period, and may increase occasions at which the forward current flows during the excessive reverse current EM period. As will be described in detail later, there is a case where adjusting a voltage supplied to an electronic equipment may allow control of whether the forward current or the reverse current flows through the semiconductor device. When such control is performed, the occasions at which the reverse current flows are increased during the excessive forward current EM period, and thus it is possible to reduce the imbalance amount of EM generated in the joint layer, and the occasions at which the forward current flows are increased during the excessive reverse current EM period, and thus it is possible to reduce the imbalance amount of EM generated in the joint layer.

In a case where the forward current and the reverse current alternately flow within a predetermined time, the increasing of the occasions at which the forward current flows leads to raising a degree of increase in the progression index of EM caused by the forward current within the predetermined time. The increasing of the temperature of the joint layer when the forward current is passed and/or the increasing of the occasions at which the forward current flows are equivalent to switching to the condition to accelerate the increase rate of the progression index of the EM caused by the forward current. In order to achieve the acceleration, both the increasing of the temperature of the joint layer and the increasing of the occasions at which the forward current flows may be implemented together. Likewise, the increasing of the temperature of the joint layer when the reverse current is passed and/or the increasing of the occasions at which the reverse current flows are equivalent to switching to the condition to accelerate the increase rate of the progression index of the EM caused by the reverse current. Both the increasing of the temperature of the joint layer and the increasing of the occasions at which the reverse current flows may be implemented together.

When the condition to accelerate the increase rate of the progression index of the EM caused by the reverse current is adopted in the excessive forward current EM period, the progression index of the EM generated by the reverse current in the joint layer is increased. As a result, the progression index of the EM generated by the forward current in the joint layer and the progression index of the EM generated by the reverse current in the joint layer are balanced. By contrast, when the condition to accelerate the increase rate of the progression index of the EM caused by the forward current is adopted in the excessive reverse current EM period, the progression index of the EM generated by the forward current in the joint layer is increased. As a result, the progression index of the EM generated by the forward current in the joint layer and the progression index of the EM generated by the reverse current in the joint layer are balanced. When both of the progression indices are balanced, the adoption of the conditions to accelerate the increase rates may be stopped.

What is meant by "the forward current EM progression index is larger than the reverse current EM progression index" is that a difference obtained by subtracting the reverse current EM progression index from the forward current EM progression index is a first predetermined value or more. What is meant by "the reverse current EM progression index is larger than the forward current EM progression index" is that a difference obtained by subtracting the forward current EM progression index from the reverse current EM progression index is the first predetermined value or more. What is meant by "the forward current EM progression index and the reverse current EM progression index are balanced" is that the absolute value of a difference between the forward current EM progression index and the reverse current EM progression index is reduced to a second predetermined value or less. A relationship of the first predetermined value>the second predetermined value is set. When the absolute value of the imbalance amount of EM reaches the first predetermined value or more, processing for cancelling out the imbalance is performed, whereas when the absolute value of the imbalance amount of EM reaches the second predetermined value or less, the processing for cancelling out the imbalance is terminated. A magnitude of the imbalance amount of EM refers to the absolute value of the difference (imbalance EM progression index) between the forward current EM progression index and the reverse current EM progression index. The cancelling out of the imbalance amount of EM means reducing the absolute value of the difference.

BRIEF DESCRIPTION OF DRAWINGS

FIGS. 3(1) to 3(4) show directions of current flowing through the joint layers;

DETAILED DESCRIPTION

The technology described in the present disclosure is extremely useful for an electric automobile which includes a motor and a drive wheel and travels by rotating the drive wheel with the motor. The electric automobile described here includes an electric automobile in which power is supplied from a battery to a motor, a fuel-cell battery automobile in which power is supplied from a fuel-cell battery to a motor, an automobile in which power is supplied from a generator driven by an engine to a motor, and a hybrid automobile which includes an engine in addition to a motor and in which a drive wheel is rotated by the motor and/or the engine.

The electric automobile in which the drive wheel is driven by the motor includes an electric power conversion equipment that is connected to the motor. Among electric automobiles, an automobile is known which includes a bidirectional converter having both a voltage boosting function and a voltage reducing function, boosts a battery voltage, supplies the boosted voltage to a motor, reduces a voltage generated by the motor operating as a generator and charges the battery by the reduced voltage. The bidirectional converter is part of the electric power conversion equipment. In the present disclosure, a case where power is supplied to the motor to rotate the drive wheel is referred to as "power running", and a case where the drive wheel applies torque to the motor and thus the motor generates power is referred to as "regeneration". The electric power conversion equipment at the time of power running boosts a battery voltage to convert it into a motor drive current, and the electric power conversion equipment at the time of regeneration converts power generated by the motor into a charge current of the battery. Although the motor in this context may be referred to as a "motor generator" by focusing attention on the fact that the motor serves as a motor or a generator, in the present disclosure the motor is simply referred to as a motor. In a case of a hybrid automobile, a motor or both the motor and the drive wheel can be rotated by an engine. This is also regeneration.

Figure 2:
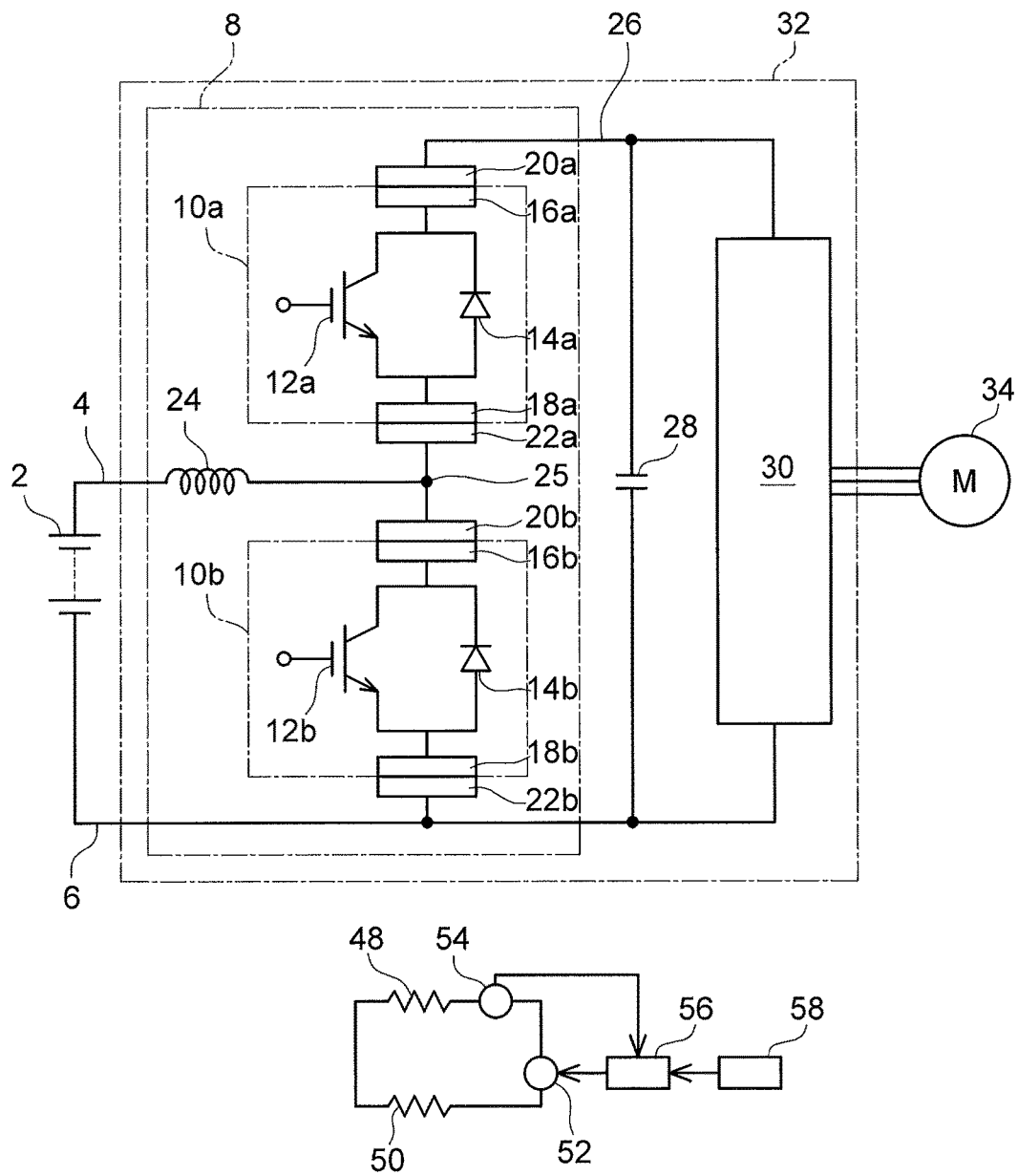
FIG. 2 shows an electric power conversion equipment, a bidirectional converter and joint layers in an electric automobile.

A technology is known in which, as shown in FIG. 2, a bidirectional converter 8 comprises two semiconductor devices 10a and 10b and a reactor 24. The two semiconductor devices 10a and 10b are the same as each other, and in the present disclosure, when common matters the devices 10a and 10b share are described, alphabet subscripts (i.e., a and b) are omitted. Each semiconductor device 10 includes a switching element 12, a diode 14 connected in parallel to the switching element 12 and a pair of electrodes (for example, a high potential electrode 16 and a low potential electrode 18).

The semiconductor device on one side (the first semiconductor device 10a in the present disclosure) is connected to a high potential wiring 26 (the wiring to which a voltage obtained by boosting a voltage of a battery 2 is applied). The semiconductor device on the other side (the second semiconductor device 10b in the present disclosure) is connected to a low potential wiring 6 (the wiring which is connected to a low potential terminal of the battery 2). The first semiconductor device 10a and the second semiconductor device 10b are connected in series between the high potential wiring 26 and the low potential wiring 6, and a connection point 25 between the first semiconductor device 10a and the second semiconductor device 10b is connected via the reactor 24 and a wiring 4 to a high potential terminal of the battery 2. Reference numeral 28 represents a capacitor that smooths out the voltage of the high potential wiring 26, reference numeral 30 represents an inverter that performs conversion into drive power supplied to a motor 34 and reference numeral 32 represents an electric power conversion equipment.

Reference numerals 20 and 22 represent joint layers (for example, solder layers) that are connected to the pair of electrodes 16 and 18. The joint layer 20a connects one electrode 16a of the first semiconductor device 10a to the high potential wiring 26. The joint layer 22a connects the other electrode 18a of the first semiconductor device 10a to the reactor 24 and the second semiconductor device 10b. The joint layer 20b connects one electrode 16b of the second semiconductor device 10b to the reactor 24 and the first semiconductor device 10a. The joint layer 22b connects the other electrode 18b of the second semiconductor device 10b to the low potential wiring 6.

Figure 5:
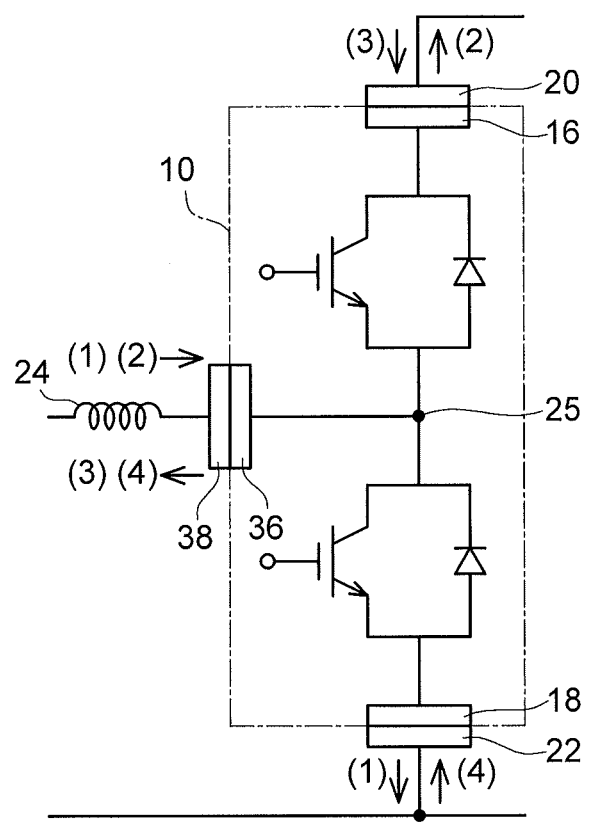
FIG. 5 shows a case where one semiconductor device incorporates a circuit in which a pair of units are connected in series and each of the units includes a switching element and a diode connected in parallel to the switching element.

The joint layer 20a is a high potential joint layer of the first semiconductor device 10a, and corresponds to the high potential joint layer in the present disclosure. The joint layer 22b is a low potential joint layer of the second semiconductor device 10b, and corresponds to the low potential joint layer in the present disclosure. As shown in FIG. 5, which will be described later, there is a case where both the joint layers 22a and 20b are not present.

FIGS. 3(1) and 3(2) show directions of current flowing at the power running (at the time of voltage boosting) in which a potential obtained by boosting a potential of the wiring 4 is applied to the high potential wiring 26 by the bidirectional converter 8. In the present disclosure, current flowing from the high potential wiring 26 toward the low potential wiring 6 is referred to as "forward current", and current flowing from the low potential wiring 6 toward the high potential wiring 26 is referred to as "reverse current". In a transient period, which will be described later, due to the presence of the reactor 24, the potential of the low potential wiring 6 can be temporarily increased as compared with the potential of the high potential wiring 26 and the reverse current accordingly flows. In the transient period, a magnitude relationship of potential may be reversed.

FIG. 3(1) shows a state where the forward current flows through the low potential joint layer 22b, and FIG. 3(2) shows a state where the reverse current flows through the high potential joint layer 20a. At the time of power running, the state of FIG. 3(1) and the state of FIG. 3(2) are alternately switched.

FIGS. 3(3) and 3(4) show directions of current flowing at the regeneration (at the time of voltage reduction) in which a voltage obtained by reducing a voltage applied to the high potential wiring 26 is applied to the wiring 4 by the bidirectional converter 8.

FIG. 3(3) shows a state where the forward current flows through the high potential joint layer 20a, and FIG. 3(4) shows a state where the reverse current flows through the low potential joint layer 22b, At the time of regeneration, the state of FIG. 3(3) and the state of FIG. 3(4) are alternately switched.

Figure 1:
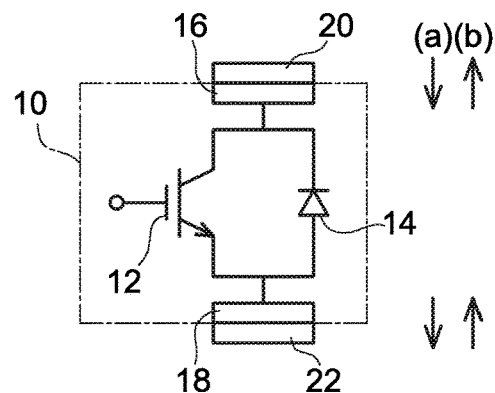
FIGS. 1(1) to 1(3) show examples of circuit configurations of a semiconductor device.
Figure 1:
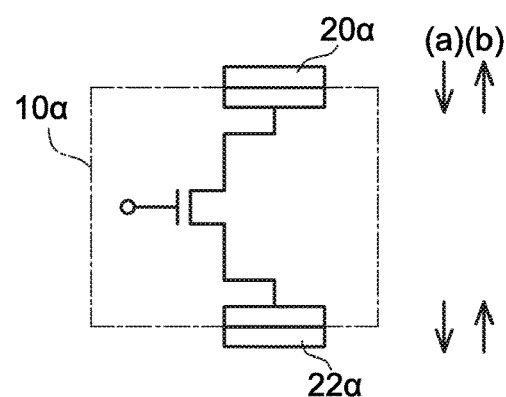
Figure 1:
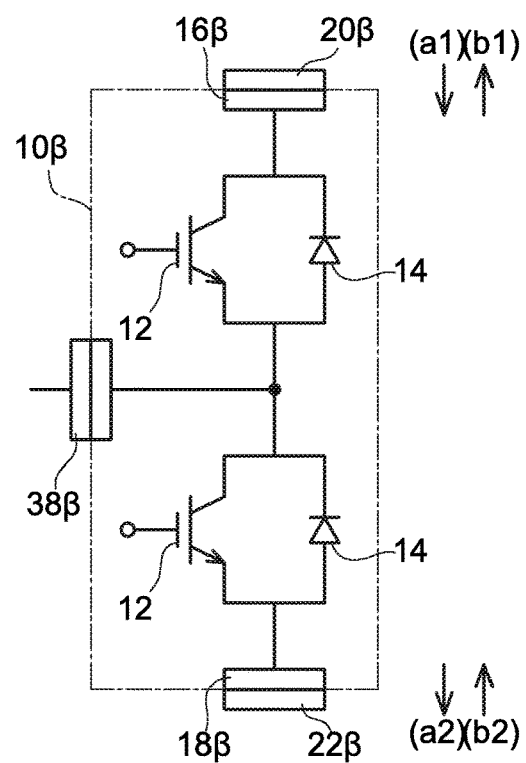

It is found that the semiconductor device 10 of FIG. 1(1) is both the semiconductor device 10a that forms an upper arm of the bidirectional converter 8 and the semiconductor device 10b that forms a lower arm thereof It is found that the bidirectional converter 8 can be configured even with the semiconductor device 10α of FIG. 1(2) that is also bidirectional. It is also found that the bidirectional converter 8 can be configured even with a bidirectional semiconductor device 10β of FIG. 1(3). It is found that in any one of FIGS. 1(1), 1(2) and 1(3), states where the forward current flows through the joint layers 20, 22, 20α, 22α, 20α and 22β and states where the reverse current flows through the joint layers 20, 22, 20α, 22α, 20β and 22β are switched, respectively.

Features when the technology described in the present disclosure is applied to a converter of an electric automobile are shown below. In a case of the electric power conversion equipment described below, as shown in FIG. 3, following two states alternately occur at the time of power running: (1) a state where forward current flows through a low potential joint layer and (2) a state where reverse current flows through a high potential joint layer, and following two states alternately occur at the time of regeneration: (3) a state where the forward current flows through the high potential joint layer, and (4) a state where the reverse current flows through the low potential joint layer.

The progression degree of EM generated in the joint layer is affected by a total amount of current passed and a mobility of ions when current is passed. As the total amount of current passed is increased, the EM proceeds, whereas as the mobility of ions is higher, the EM rapidly proceeds. The mobility of ions mainly depends on the temperature of the joint layer. By collecting over time, data indicating the current passed and the temperature of the joint layer at that timing, an index indicating the progression degree of EM can be calculated. The electric automobile disclosed herein collects, over time, data indicating a magnitude of the current passed and the temperature of the joint layer at that time to calculate the progression index of EM.

A direction in which ions causing EM move is changed depending on the direction in which current is passed. When reverse current EM is generated after forward current EM is generated, the forward current EM is cancelled out by the reverse current EM, and the progression index of EM actually generated in the joint layer is accordingly reduced. Likewise, when forward current EM is generated after reverse current EM is generated, the reverse current EM is cancelled out by the forward current EM, and the progression index of EM actually generated in the joint layer is accordingly reduced. When both the forward current EM progression index and the reverse current EM progression index are assumed to have a same positive or negative sign, a difference (imbalance amount) between them indicates the progression index of the EM actually generated in the joint layer.

In a case of an electric automobile, large EM is more often generated in the low potential joint layer 22*b* than in the high potential joint layer 20*a*. If the imbalance amount of EM generated in the low potential joint layer 20*a* can be maintained at a low level, it is extremely effective. Hence, the electric automobile described in the present disclosure includes the controller configured to compare (1) the progression index of the EM generated by the forward current in the low potential joint layer 22*b* with (4) the progression index of the EM generated by the reverse current in the low potential joint layer 22*b*, and when the former is higher than the latter, the temperature of the joint layer during the regeneration is increased, whereas when the latter is higher than the former, the temperature of the joint layer during the power running is increased.

Hence, when the progression index of the EM of the low potential joint layer 22*b* generated by the forward current of FIG. 3(1) at the time of power running is higher than the progression index of the EM of the low potential joint layer 22*b* generated by the reverse current of FIG. 3(4) at the time of regeneration, the temperature of the joint layer during the regeneration is increased. As a result, the EM is made to rapidly proceed in the subsequent regeneration operation and thus the imbalance amount of EM is cancelled out. By contrast, when the progression index of the EM of the low potential joint layer 22*b* generated by the forward current of FIG. 3(1) at the time of power running is lower than the progression index of the EM for the low potential joint layer 22*b* generated by the reverse current of FIG. 3(4) at the time of regeneration, the temperature of the joint layer during the power running is increased. As a result, the EM is made to rapidly proceed in the subsequent power running and thus the imbalance amount of EM is cancelled out. In this way, it is possible to maintain the imbalance amount of EM generated in the low potential joint layer 22*b* at a low level.

Thus, in the case of an electric automobile, the large EM is more often generated in the low potential joint layer than in the high potential joint layer. If the imbalance amount of EM generated in the low potential joint layer can be maintained at a low level, it is extremely effective.

The imbalance amount of EM generated in the joint layer 20*b* is equal to the imbalance amount of EM generated in the low potential joint layer 22*b*. When a control technology for maintaining the imbalance amount of EM at a low level is adopted to the low potential joint layer 22*b*, the imbalance amount of EM generated in the joint layer 20*b* is also maintained at a low level.

The technology described in the present disclosure can be practiced in various ways, and may have the following features.

(Feature 1) An electric vehicle comprises an electric power conversion equipment and a motor connected to the electric power conversion equipment. The electric power conversion equipment comprises a bidirectional converter that performs a voltage boosting function and a voltage reducing function. The bidirectional converter comprises a semiconductor device including a circuit in which units are connected in series. Each of the units includes a switching element and a diode connected to the switching element in parallel. A high potential electrode of the semiconductor device is connected to a high potential wiring via a high potential joint layer, and a low potential electrode of the semiconductor device is connected to a low potential wiring via a low potential joint layer. Current flowing from the high potential wiring to the low potential wiring is denoted as forward current, and current flowing from the low potential wiring to the high potential wiring is denoted as reverse current. A state in which the forward current flows through the low potential joint layer and a state in which the reverse current flows through the high potential joint layer alternately occur during a power running operation. A state in which the forward current flows through the high potential joint layer and a state in which the reverse current flows through the low potential joint layer alternately occur during a regeneration operation.

(Feature 2) An electric automobile as in feature 1 wherein an imbalance amount of EM is generated at a larger degree in the low potential joint layer than in the high potential joint layer may include a controller configured to compare a progression index of the EM generated by the forward current of FIG. 3(1) in the low potential joint layer with the progression index of the EM generated by the reverse current of FIG. 3(4) in the low potential joint layer, and when the former is higher than the latter, a temperature of the joint layer during the regeneration is increased whereas when the latter is higher than the former, the temperature of the joint layer during the power running is increased.

(Feature 3) An electric automobile as in feature 1 wherein the imbalance amount of EM is generated at a larger degree in the high potential joint layer than in the low potential joint layer may include a controller configured to compare a progression index of the EM generated by the reverse current of FIG. 3(2) in the high potential joint layer with a progression index of the EM generated by the forward current of FIG. 3(3) in the high potential joint layer, and when the former is higher than the latter, the temperature of the joint layer during the regeneration is increased whereas when the latter is higher than the former, the temperature of the joint layer during the power running is increased.

(Feature 4) An electric automobile as in feature 1 wherein when it is impossible to predict a magnitude relationship between the imbalance amounts of the EM generated in the low potential joint layer and the EM generated in the high potential joint layer, the controller is configured to cancel out the imbalance amount depending on the joint layer in which an absolute value of the imbalance amount is relatively higher. When an absolute value of the imbalance amount of EM generated in the low potential joint layer is higher than an absolute value of the imbalance amount of EM generated in the high potential joint layer, the technology of feature 2 is adopted and the imbalance amount generated in the low potential joint layer is reduced. When the absolute value of the imbalance amount of EM generated in the high potential joint layer is higher than the absolute value of the imbalance amount of EM generated in the low potential joint layer, the technology of feature 3 is adopted and the imbalance amount generated in the high potential joint layer is reduced.

In a hybrid automobile, it is possible to control whether the power running operation or the regeneration operation is performed by adjusting a magnitude relationship between power for rotating a drive wheel and an output of an engine. For example, when the power for rotating the drive wheel cannot be sufficiently provided by the output of the engine, the motor performs the power running operation. By contrast, when the engine produces an output that is greater than the power needed for rotating the drive wheel, the motor performs the regeneration operation. By utilizing such control, it is possible to cancel out the imbalance amount of the EM generated in the joint layer. When the EM caused by the power running is predominant, it is thus possible to cancel out the imbalance amount by making an adjustment to increase a frequency of occurrence of the regeneration operation. When the EM caused by the regeneration is predominant, it is thus possible to cancel out the imbalance amount by making an adjustment to increase a frequency of occurrence of the power running.

(Feature 5) In a hybrid automobile that comprises an electric power conversion equipment, a motor connected to the electric power conversion equipment, an engine and a power transfer mechanism that adjusts a transfer distribution of power between the motor, the engine and a drive wheel.

during the power running operation, during which an output of the engine is insufficient to power the drive wheel by the requisite amount, (1) a state where forward current flows through a low potential joint layer and (2) a state where reverse current flows through a high potential joint layer alternately occur, and during the regeneration operation during which the output of the engine exceeds the requisite amount of power needed to power the drive wheel, (3) a state where the forward current flows through the high potential joint layer and (4) a state where the reverse current flows through the low potential joint layer alternately occur.

(Feature 6) A hybrid automobile where the imbalance amount of EM is generated at a larger degree in the low potential joint layer than in the high potential joint layer may include a controller configured to compare the progression index of the EM generated by the forward current of FIG. 3(1) in the low potential joint layer with the progression index of the EM generated by the reverse current of FIG. 3(4) in the low potential joint layer. When the former is higher than the latter, the controller increases an output of an engine to raise the frequency of the occurrence of the regeneration. When the latter is higher than the former, the controller reduces the output of the engine to raise the frequency of the occurrence of the power running.

(Feature 7) A hybrid automobile where the imbalance amount of EM is generated at a larger degree in the high potential joint layer than in the low potential joint layer may include a controller configured to compare the progression index of the EM generated by the reverse current of FIG. 3(2) in the high potential joint layer with the progression index of the EM generated by the forward current of FIG. 3(3) in the high potential joint layer. When the former is higher than the latter, the controller increases the output of an engine to raise the frequency of the occurrence of the regeneration. When the latter is higher than the former, the controller reduces the output of the engine to raise the frequency of the occurrence of the power running.

(Feature 8) In a hybrid automobile where it is impossible to predict a high-low relationship between imbalance amounts of the EM generated in a low potential joint layer and a high potential joint layer, the imbalance amount is reduced depending on the joint layer in which an absolute value of the imbalance amount is higher. When the absolute value of the imbalance amount of EM generated in the low potential joint layer is higher than the absolute value of the imbalance amount of EM generated in the high potential joint layer, the technology of feature 6 is adopted to reduce the imbalance amount generated in the low potential joint layer, whereas when the absolute value of the imbalance amount of EM generated in the high potential joint layer is higher than the absolute value of the imbalance amount of EM generated in the low potential joint layer, the technology of feature 7 is adopted to reduce the imbalance amount generated in the high potential joint layer.

(Feature 9) In a case where the temperature of the joint layer has been increased to reduce the imbalance amount of EM and/or in a case where the output of an engine has been adjusted to adjust the frequency of the occurrence of the power running or the regeneration so as to reduce the imbalance amount of EM, the increasing of the temperature and/or the adjustment of the engine output are stopped when the absolute value of the imbalance amount that has been reduced reaches a predetermined value.

Embodiments

FIG. 2 shows the battery 2, the electric power conversion equipment 32 and the motor 34 included in an electric automobile. The electric automobile travels by rotating unillustrated drive wheels with the motor 34.

The electric power conversion equipment 32 includes the bidirectional converter 8, the smoothing capacitor 28 and the inverter 30. At the time of power running, the bidirectional converter 8 boosts the voltage of the battery 2 and applies the boosted voltage to the inverter 30. The inverter 30 converts direct current into three-phase alternating current, and supplies it to the motor 34. At the time of regeneration, the motor 34 generates power by force applied from the driving wheels to the motor 34. Three-phase alternating current generated by the motor 34 is converted by the inverter 30 into direct current, the converted voltage is reduced by the bidirectional converter 8 and the reduced voltage charges the battery 2.

The bidirectional converter 8 includes the reactor 24, the semiconductor device 10a and the semiconductor device 10b. The semiconductor devices 10a and 10b are the same as each other, and in the following discussion, a description regarding the devices 10a and 10b will be given as one same semiconductor device with the subscripts (a, b) omitted.

The semiconductor device 10 includes the switching element 12 and the diode 14 connected in parallel to the switching element 12. The switching element 12 switches current flowing from a high potential wiring 26 side toward a low potential wiring 6 side, and current flowing from the low potential wiring 6 side toward the high potential wiring 26 side cannot flow through the switching element 12. The current flowing from the low potential wiring 6 side toward the high potential wiring 26 side flows through the diode 14. The switching element 12 and the diode 14 are connected in parallel in opposite directions. Since the reactor 24 is present, current can transiently flow from the low potential wiring 6 side toward the high potential wiring 26 side.

The semiconductor device 10 (10a, 10b) includes the high potential electrode 16 (16a, 16b) and the low potential electrode 18 (18a, 18b). The high potential electrode 16a of the semiconductor device 10a is mechanically and electrically joined with the high potential joint layer 20a to the high potential wiring 26. The low potential electrode 18b of the semiconductor device 10b is mechanically and electrically joined with the low potential joint layer 22b to the low potential wiring 6. The low potential electrode 18a of the semiconductor device 10a is mechanically and electrically joined with the high potential side intermediate joint layer 22a to the reactor 24 and the semiconductor device 10b. The high potential electrode 16b of the semiconductor device 10b is mechanically and electrically joined with the low potential intermediate joint layer 20b to the reactor 24 and the semiconductor device 10a.

Reference numeral 4 represents a wiring connected to the high potential electrode of the battery 2, reference numeral 6 represents a low potential wiring and reference numeral 26 represents the high potential wiring 26.

FIGS. 3(1) and 3(2) show current paths along which current flows at the time of power running (at the time of voltage boosting). In FIG. 3(1), the forward current flows through the low potential joint layer 22b and the low potential side intermediate joint layer 20b, and in FIG. 3(2), the reverse current flows through the high potential joint layer 20a and the high potential side intermediate joint layer 22a. FIGS. 3(1) and 3(2) alternately occur.

FIGS. 3(3) and 3(4) show current paths along which current flows at the time of regeneration (at the time of voltage reduction). In FIG. 3(3), the forward current flows through the high potential joint layer 20a and the high potential side intermediate joint layer 22a, and in FIG. 3(4), the reverse current flows through the low potential joint layer 22b and the low potential side intermediate joint layer 20b.

When attention is focused on the high potential joint layer 20a, it is found that at the time of power running, the reverse current of FIG. 3(2) flows, and at the time of regeneration, the forward current of FIG. 3(3) flows. In the high potential joint layer 20a, the EM caused by the reverse current of FIG. 3(2) and the EM caused by the forward current of FIG. 3(3) proceed in opposite directions. However, since in a conventional technology, such a relationship in which the EM of FIG. 3(2) is adjusted to be cancelled out by the EM of FIG. 3(3) is not made, the difference between the EM of FIG. 3(2) and the EM of FIG. 3(3) is accumulated and thus the imbalance amount of EM generated in the high potential joint layer 20a may reach a large value.

When attention is focused on the low potential joint layer 22b, it is found that at the time of power running, the forward current of FIG. 3(1) flows, and at the time of regeneration, the reverse current of FIG. 3(4) flows. In the low potential joint layer 22b, the EM caused by the forward current of FIG. 3(1) and the EM caused by the reverse current of FIG. 3(4) proceed in opposite directions. However, since in the conventional technology, such a relationship in which the EM of FIG. 3(1) is adjusted to be cancelled out by the EM of FIG. 3(4) is not made, the difference between the EM of FIG. 3(1) and the EM of FIG. 3(4) is accumulated and thus the imbalance amount of EM generated in the low potential joint layer 22b may reach a large value.

An example that will be described below handles a case where a magnitude relationship between a magnitude of the imbalance amount of EM generated in the high potential joint layer 20a and a magnitude of the imbalance amount of EM generated in the low potential joint layer 22b is unknown and where it is unknown in which the high potential joint layer 20a or the low potential joint layer 22b a larger imbalance amount of EM is generated.

Figure 4:
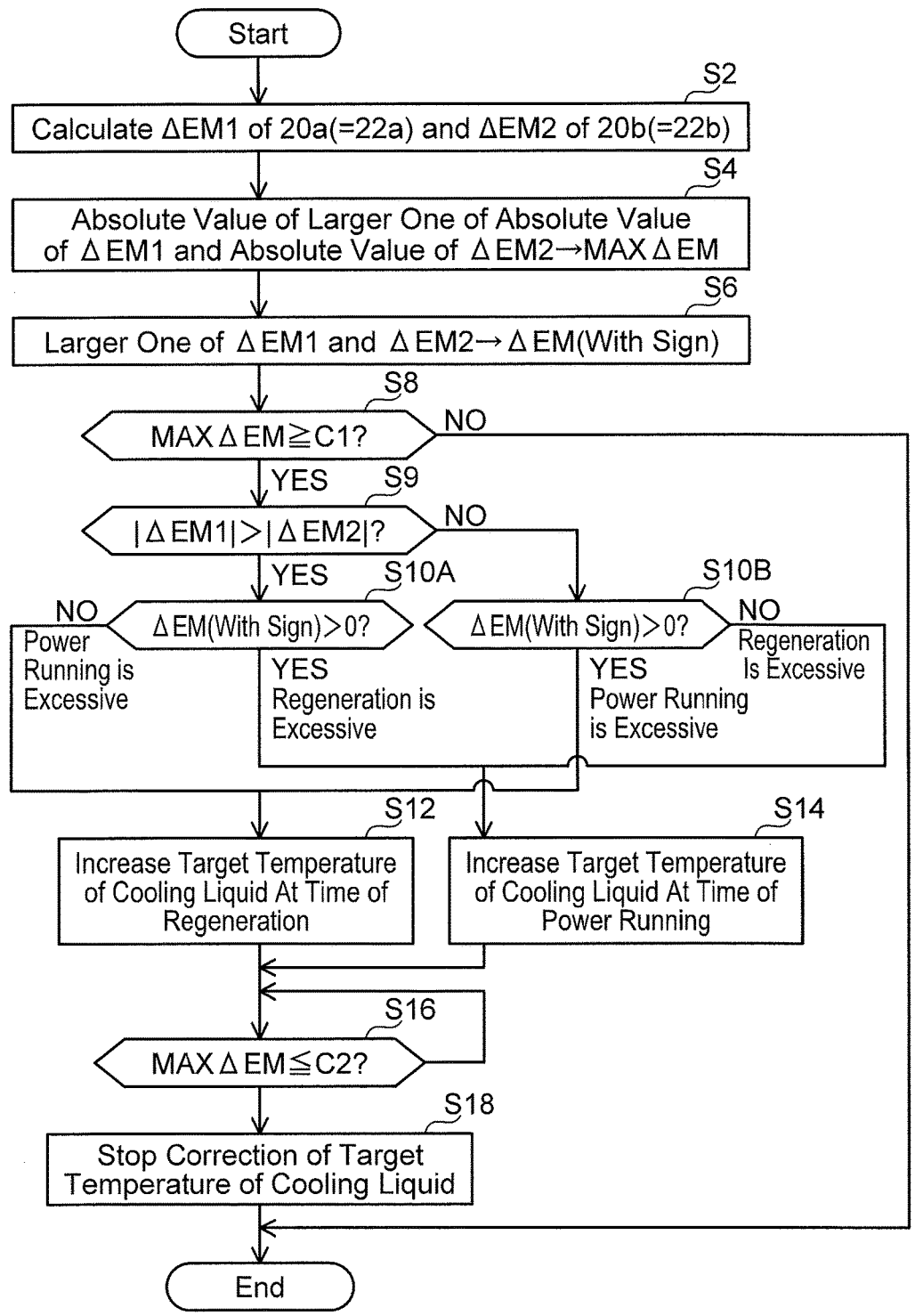
FIG. 4 shows a control procedure for cancelling out an imbalance amount of EM.

FIG. 4 shows a control procedure for preventing the magnitude of the imbalance amount of EM from reaching an excessive level.

In step S2, an index $\Delta$EM1 that indicates the magnitude of the imbalance amount of EM generated in the high potential joint layer 20a and an index $\Delta$EM2 that indicates the magnitude of the imbalance amount of EM generated in the low potential joint layer 22b are calculated.

Figure 8:
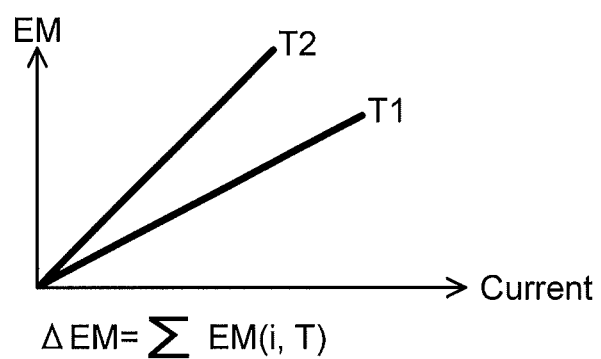
FIG. 8 schematically shows a relationship between a degree of progression of EM, a current value and a temperature.

As schematically shown in FIG. 8, a progression amount (=a progression rate, a vertical axis) of EM generated in a joint layer per unit time is increased with an amount of charge (=a current value, a horizontal axis) that is passed through the joint layer per unit time. Even when the current value is the same, the progression rate is changed depending on the temperature of the joint layer when current is passed.

Specifically, when the temperature is a high temperature (T2), the progression rate is large whereas when the temperature is a low temperature (T1), the progression rate is small. The electric automobile of the example collects, over time, data indicating the value of current passed and the temperature of the joint layer at that time, and has a function of calculating the progression index of EM. For example, in a two-dimensional map in which the horizontal axis represents the current value and the vertical axis represents the temperature of the joint layer, values indicating the progression rates of EM are stored. This map can be prepared in advance by actually measuring the current values, the temperatures and the progression rates of EM. The progression rates EM (i, T) corresponding to the current values and the temperatures are read and integrated, and thus the progression index of EM can be calculated. Both the progression index of EM caused by the forward current and the progression index of EM caused by the reverse current are calculated as having positive values. A progression index $\Delta$EM indicating the magnitude of the imbalance amount of EM is calculated by the difference between the progression index of EM caused by the forward current and the progression index of EM caused by the reverse current. When the EM caused by the forward current is predominant over the EM caused by the reverse current, $\Delta$EM is a positive value.

In step S4 of FIG. 4, an absolute value of $\Delta$EM1 is compared with an absolute value of $\Delta$EM2, and a larger absolute value is assumed to be MAX$\Delta$EM.

In step S6, $\Delta$EM (with positive or negative sign) having a larger absolute value between $\Delta$EM1 and $\Delta$EM2 is assumed to be $\Delta$EM (with sign).

In step S8, the MAX$\Delta$EM is compared with an allowable value C1. The allowable value C1 indicates an allowable value for the imbalance amount of EM, and when MAX$\Delta$EM<C1, this case corresponds to a case where it is not necessary to perform control for the reduction of the imbalance amount of EM. When MAX$\Delta$EM<C1 (No in step S8), the process does not proceed to processing in step S9 and subsequent steps.

When MAX$\Delta$EM$\geq$C1, the magnitude of the imbalance amount of EM is larger than the allowable value C1, and this case corresponds to a case where it is necessary to perform control for the reduction of the imbalance amount of EM. In such a case, in step S9, the magnitude relationship between the absolute value of $\Delta$EM1 and the absolute value of $\Delta$EM2 is determined. The magnitude of the imbalance amount of EM generated in the high potential joint layer 20a is compared with the magnitude of the imbalance amount of EM generated in the low potential joint layer 22b. Then, whether the $\Delta$EM (with sign) is positive or negative is determined. When the absolute value of $\Delta$EM1>the absolute value of $\Delta$EM2 and the EM (with sign)=positive, it is found that the passage of current shown in FIG. 3(3) is predominant and the regeneration is excessive. When the absolute value of $\Delta$EM1>the absolute value of $\Delta$EM2 and the $\Delta$EM (with sign)=negative, it is found that the passage of current shown in FIG. 3(2) is predominant and the power running is excessive. When the absolute value of $\Delta$EM1<the absolute value of $\Delta$EM2 and the EM (with sign)=positive, it is found that the passage of current shown in FIG. 3(1) is predominant and the power running is excessive. When the absolute value of $\Delta$EM1<the absolute value of $\Delta$EM2 and the $\Delta$EM (with sign)=negative, it is found that the passage of current shown in FIG. 3(4) is predominant and the regeneration is excessive.

When the power running is excessive, in step S12, the target temperature of a cooling liquid at the time of regeneration is increased. In the present example, the semiconductor devices 10, the joint layers 20 and 22 and the like are cooled with the cooling liquid. In FIG. 2, reference numeral 48 represents a heat exchanger that exchanges heat between the semiconductor devices 10 (the joint layers 20, 22 and the like) and the cooling liquid. Reference numeral 50 represents a heat exchanger that exchanges heat between the cooling liquid and the atmosphere. Reference numeral 52 represents a cooling liquid pump. The cooling liquid is circulated by the pump 52, cools down the joint layers 20 and 22 while being heated there, and is cooled by the heat exchanger 50. The cooling liquid repeats this circulation. Reference numeral 54 represents a temperature sensor that detects a temperature of the cooling liquid, and a pump control device 56 performs feed-back control on a number of revolutions of the pump 52 to maintain the temperature of the cooling liquid at a target temperature. Reference numeral 58 represents a control device that has a function of calculating the forward current EM progression index, the reverse current EM progression index and the imbalance EM progression index and that performs the control procedure of FIG. 4. When step S12 is performed, the target temperature of the cooling liquid in the regeneration operation is increased. In the regeneration operation, the pump 52 is stopped until the temperature of the cooling liquid reaches the increased target temperature. After step S12 is performed, the regeneration operation is performed in an environment in which the temperature of the joint layers 20 and 22 is high, and the power running operation is performed in an environment in which the temperature of the joint layers 20 and 22 is low. When the temperature of the joint layers 20 and 22 is high, the EM rapidly proceeds. After step S12 is performed, as a result, in the regeneration operation following step S12, the imbalance amount of EM is reduced.

When the regeneration is excessive, in step S14, the target temperature of the cooling liquid at the time of power running is increased. After step S14 is performed, the power running operation is performed in the environment in which the temperature of the joint layers 20 and 22 is high, and the regeneration operation is performed in the environment in which the temperature of the joint layers 20 and 22 is low. When the temperature of the joint layers 20 and 22 is high, the EM rapidly proceeds. After step S14 is performed, as a result, in the power running operation following step S14, the imbalance amount of EM is reduced.

Even if the EM caused by the power running was predominant when step S10 was performed, when step S12 is performed, the EM rapidly proceeds in the subsequent regeneration operation, and the EM in the power running is cancelled out by the EM in the regeneration. When this processing is continuously performed, in step S16, YES is selected. C2 described here is sufficiently lower than the allowable value C1 in step S8, and is such a small value by which it can be determined that the imbalance amount of EM bas become sufficiently low and that the processing for cancelling out the imbalance amount bas become unnecessary. While NO is selected in step S16, the processing in step S12 is continuously performed, and when it is determined in step S16 that, the imbalance amount has been cancelled out, step S18 is performed to complete the processing for cancelling out the imbalance amount.

Even if the EM caused by the regeneration is predominant when step S10 is performed, when step S14 is performed, the EM rapidly proceeds in the subsequent power running operation, and the EM in the regeneration is cancelled out by the EM in the power running. When this processing is continuously performed, in step S16, YES is selected. C2 described here is sufficiently lower than the allowable value C1 in step S8 and is such a small value by which it can be determined that the imbalance amount of EM has become sufficiently low and that the processing for cancelling out the imbalance amount has become unnecessary. While NO is selected in step S16, the processing in step S14 is continuously performed, and when it is determined in step S16 that the imbalance amount has been cancelled out, step S18 is performed to complete the processing for cancelling out the imbalance amount.

The processing of FIG. 4 handles a case where a magnitude relationship between the imbalance amount of EM generated in the high potential joint layer 20a and the imbalance amount of EM generated in the low potential joint layer 22b is unknown. The processing of FIG. 4 corresponds to the technology described in feature 4. Depending on an electric automobile, there is a case where it is known in advance that the imbalance amount of EM generated in the low potential joint layer 22b is larger than the imbalance amount of EM generated in the high potential joint layer 20a, and in that case, whether the power running or the regeneration is excessive may be determined depending on the low potential joint layer 22b having the larger imbalance amount. Since the determination in step S9 of FIG. 4 is not needed, the process may proceed from step S8 to step S10B. The technology described in feature 2 corresponds to this case. By contrast, there is a case where imbalance amount of EM generated in the high potential joint layer 20a is larger than the imbalance amount of EM generated in the low potential joint layer 22b, and in that case, whether the power running or the regeneration is excessive may be determined depending on the high potential joint layer 20a having the larger imbalance amount. Also in this case, the determination in step S9 of FIG. 4 is not needed, and the process may proceed from step S8 to step S10A. The technology described in feature 3 corresponds to this case.

As is clear from FIGS. 3(2) and 3(3), the EM generated in the high potential joint layer 20a and the EM generated in the high potential side intermediate joint layer 22a are the same. Therefore, by performing processing for suppressing the EM generated in the high potential joint layer 20a, the imbalance amount of EM generated in the high potential side intermediate joint layer 22a is also suppressed. Likewise, as is clear from FIGS. 3(1) and 3(4), the EM generated in the low potential joint layer 22b and the EM generated in the low potential side intermediate joint layer 20b are the same. Therefore, by performing processing for suppressing the EM generated in the low potential joint layer 22b, the imbalance amount of EM generated in the low potential side intermediate joint layer 20b is also suppressed.

Although the example described above describes the case where the two semiconductor devices 10a and 10b are joined with the four joint layers 20a, 22a, 20b and 22b, the technology described in the example is not limited only to this example. The technology described in the example can be applied to a case where one semiconductor device is joined with two joint layers as shown in FIGS. 1(1) and 1(2). In this case, same imbalance amounts of EM are generated in the two joint layers, and by performing the processing for cancelling out the imbalance amount of EM, both the imbalance amounts of EM in the two joint layers are commonly reduced. Hence, the processing procedure of FIG. 4 is simplified. Whether the power running or the regeneration is excessive can be determined by focusing on either one of the joint layers, and step S12 or step S14 can be selected by that determination result. As shown in FIG. 1(3) or 5, the technology is also useful for a case where the bidirectional converter is configured of one semiconductor device without the presence of the high potential side intermediate joint layer 22a and the low potential side intermediate joint layer 20b.

As shown in FIG. 5, EM may also be generated in a reactor joint layer 38 with which a reactor 24 and a semiconductor device 10 are joined. A direction of current flowing through the reactor joint layer 38 is reversed depending on whether the power running is performed or the regeneration is performed. When EM generated in the past power running has become predominant by being larger than the allowable value C1 in step S8 of FIG. 4, the imbalance amount of EM can be reduced by performing step S12 in FIG. 4. When EM generated in the past regeneration has become predominant by being larger than the allowable value C1 in step S8 of FIG. 4, the imbalance amount of EM generated in the reactor joint layer 38 can be reduced by performing step S14 of FIG. 4. When a magnitude relationship between the imbalance amounts of EM generated in a high potential joint layer 20, a low potential joint layer 22 and the reactor joint layer 38 is unknown, the processing in step S4 of FIG. 4 may be modified to processing in which a maximum absolute value among the imbalance amounts of EM in the high potential joint layer 20, the low potential joint layer 22 and the reactor joint layer 38 is focused on.

Figure 6:
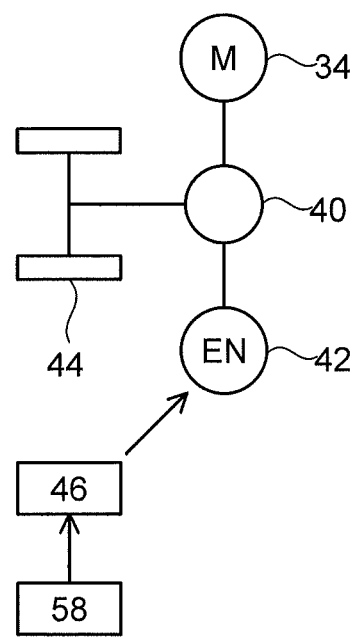
FIG. 6 shows a drive mechanism of a hybrid automobile.

As shown in FIG. 6, a hybrid automobile includes an engine 42 in addition to the motor 34, and also includes a power distribution mechanism 40 (for example, a planetary gear set) that adjusts transmission distribution of power between the motor 34, the engine 42 and drive wheels 44. In this case, when the output of the engine is insufficient as compared with the power necessary for the driving of the drive wheels 44, the motor 34 performs the power running operation to apply the necessary power to the drive wheels 44. By contrast, when the output of the engine is excessive as compared with the power necessary for the driving of the drive wheels 44, the motor 34 performs the regeneration operation to generate power. In the case of the hybrid automobile, by adjusting the output of the engine, it is possible to select whether the power running operation is performed or the regeneration operation is performed by the motor 34. Reference numeral 46 represents a device for adjusting the engine output, and reference numeral 58 represents a computer device that has a function of calculating the forward current EM progression index, the reverse current EM progression index and the imbalance EM progression index and is a controller for performing the control procedure of FIG. 7.

In the case of the hybrid automobile, when the EM that was generated in the past was caused by the power running, thereafter it is possible to reduce the imbalance amount of EM by increasing the frequency of the occurrence of the regeneration operation. Whereas when the EM that was generated in the past was caused by the regeneration, thereafter it is possible to reduce the imbalance amount of EM by increasing the frequency of the occurrence of the power running operation.

Figure 7:
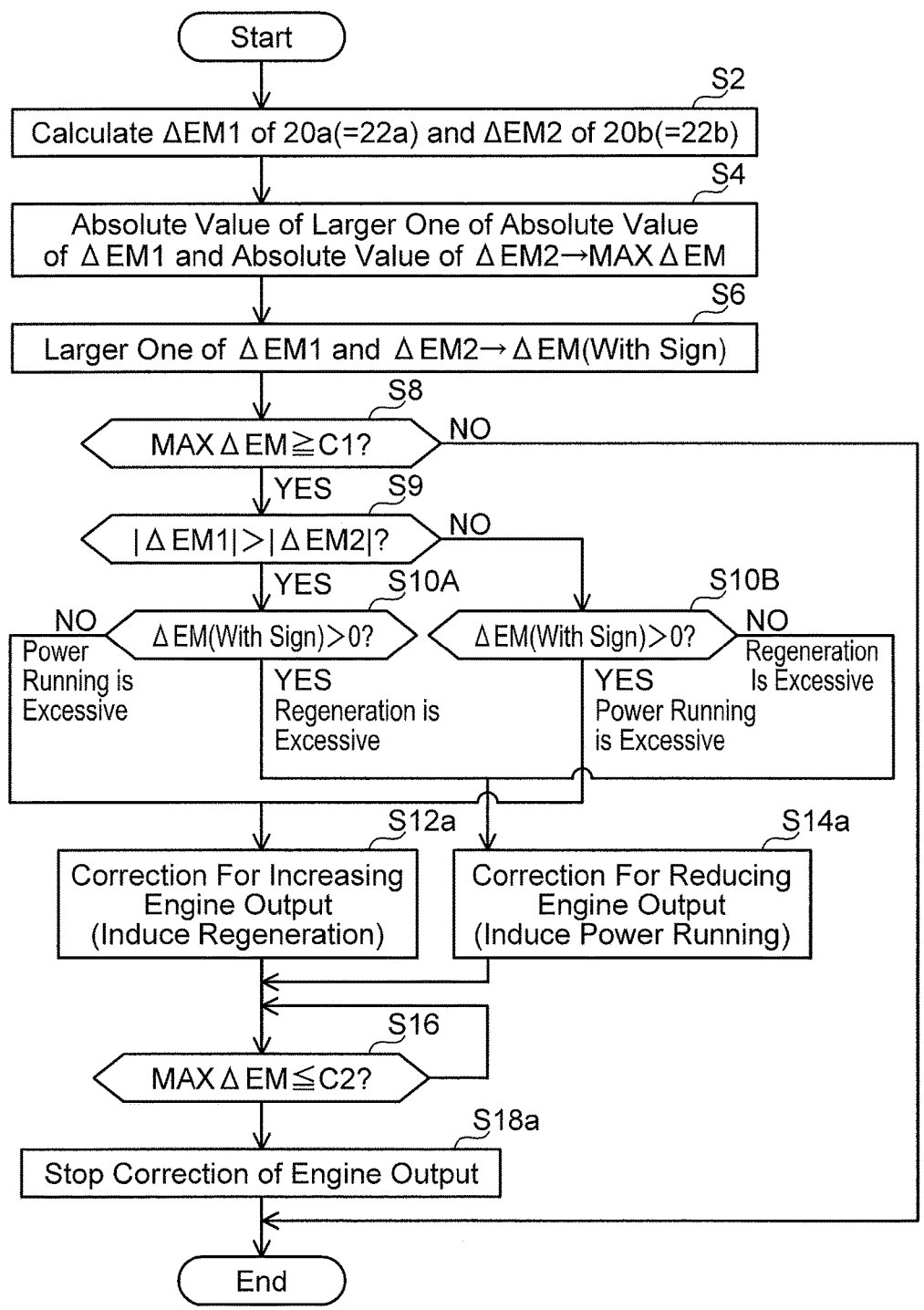
FIG. 7 shows a control procedure for cancelling an imbalance amount of EM in the hybrid automobile.

FIG. 7 is a control procedure for reducing the imbalance amount of EM generated in the joint layer of the hybrid automobile. It is similar to the processing procedure of FIG. 4, and thus description thereof that is common to FIG. 4 will not be repeated. With processing until steps S10A and S10B of FIG. 7, whether the power running is excessive or the regeneration is excessive is determined for the joint layer whose imbalance amount of EM is larger than the allowable value C1. The processing is the same as the processing of FIG. 4 until then. When the power running is excessive, a correction for increasing the engine output is performed in step S12a. Then, a frequency at which the motor 34 performs the regeneration operation is increased. It is possible to obtain a phenomenon in which the imbalance amount of EM generated by the excessive power running is reduced by the regeneration operation. When the regeneration is excessive, a correction for reducing the engine output is performed in step S14a. Then, a frequency at which the motor 34 performs the power running operation is increased. It is possible to obtain a phenomenon in which the imbalance amount of EM generated by the excessive regeneration is reduced by the power running operation.

Even in the processing of FIG. 7, when it is found that the imbalance amount of EM generated in the low potential joint layer 22b is larger than the imbalance amount of EM generated in the high potential joint layer 20a, whether the power running or the regeneration is excessive may be determined depending on the low potential joint layer 22b having the larger imbalance amount. When YES is selected in step S8, step S9 may be omitted to proceed to a determination in step S10B. The technology described in feature 6 corresponds to this case. By contrast, when it is found that the imbalance amount of EM generated in the high potential joint layer 20a is larger than the imbalance amount of EM generated in the low potential joint layer 22b, whether the power running or the regeneration is excessive may be determined depending on the high potential joint layer 20a having the larger imbalance amount. When YES is selected in step S8, step S9 may be omitted to proceed to a determination in step S10A. The technology described in feature 7 corresponds to this case. The processing of FIG. 7 is the technology that copes with the case where the magnitude relationship between the imbalance amount of EM generated in the high potential joint layer 20a and the imbalance amount of EM generated in the low potential joint layer 22b is unknown, and corresponds to the technology described in feature 8.

In the case of the hybrid automobile, not only step S12a but also step S12 of FIG. 4 can be performed. Moreover, not only step S14a but also step S14 of FIG. 4 can be performed. In the case of the hybrid automobile, only step S12, only steps S12 and 12a or only step S12a may be performed. Likewise, only step S14, only steps S14 and 14a or only step S14a may be performed.

In the above description, the IGBT is utilized as the switching element. Instead of the IGBT, a MOS may be alternatively used. The present technology can also be applied to a converter utilizing a MOS that performs a synchronous rectification operation. The present technology can also be applied to a converter utilizing a MOS incorporating a diode.

The embodiments have been described in detail above. However, these are only examples and are not intended to be limiting. The technical elements explained in the present description and drawings exert technical utility independently or in combination of some of them, and the combination is not limited to those described herein. Moreover, the technology exemplified in the present description and drawings achieves a plurality of objects at the same time, and has technical utility by achieving one or more of such objects.

What is claimed is:
1. An electronic equipment comprising:
   a semiconductor device including an electrode joined to an electric conductor via a joint layer, the semiconductor device being configured to pass current bidirectionally through the electric conductor, a direction of the current being switched over time between a state in which forward current flows through the joint layer from the electric conductor to the electrode and a state in which reverse current flows through the joint layer from the electrode to the electric conductor;

a calculator configured to calculate an imbalance EM progression index, the imbalance EM progression index being a difference between a forward current EM progression index of electromigration generated in the joint layer due to the forward current and a reverse current EM progression index of the electromigration generated in the joint layer due to the reverse current; and a controller configured to:
adopt a condition to accelerate an increase rate of the reverse current EM progression index in at least a part of an excessive forward current EM period during which the forward current EM progression index is larger than the reverse current EM progression index; and
adopt a condition to accelerate an increase rate of the forward current EM progression index in at least a part of an excessive reverse current EM period during which the reverse current EM progression index is larger than the forward current EM progression index.

2. The electronic equipment of claim 1, wherein the controller:
increases a temperature of the joint layer when the reverse current flows in the at least part of the excessive forward current EM period; and
increases the temperature of the joint layer when the forward current flows in the at least part of the excessive reverse current EM period.

3. The electronic equipment of claim 1, wherein the controller:
increases occasions at which the reverse current flows during the excessive forward current EM period; and
increases occasions at which the forward current flows during the excessive reverse current EM period.

4. The electronic equipment of claim 1, wherein the controller is further configured to not adopt the conditions to accelerate the increase rates when the forward current EM progression index and the reverse current EM progression index are balanced.

5. An electric vehicle in which the electronic equipment of claim 1 is mounted.

* * * * *